(12) United States Patent
Yu

(10) Patent No.: US 6,194,748 B1
(45) Date of Patent: Feb. 27, 2001

(54) MOSFET WITH SUPPRESSED GATE-EDGE FRINGING FIELD EFFECT

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/303,959

(22) Filed: May 3, 1999

(51) Int. Cl.$^7$ .................................................. H01L 29/76
(52) U.S. Cl. ......................... 257/216; 438/76; 438/146; 438/299; 438/301; 438/303; 438/305
(58) Field of Search ............................. 257/216; 438/299, 438/301, 303, 305, 306, 586, 589, 682, 683, 649, 651

(56) References Cited

U.S. PATENT DOCUMENTS

| | | |
|---|---|---|
| 4,683,645 | 8/1987 | Naguib et al. . |
| 4,745,082 | 5/1988 | Kwok . |
| 4,784,718 | 11/1988 | Mitani et al. . |
| 5,264,382 | 11/1993 | Watanabe . |
| 5,374,575 | 12/1994 | Kim et al. . |
| 5,391,510 | 2/1995 | Hsu et al. . |
| 5,393,685 | 2/1995 | Yoo et al. . |
| 5,429,956 | 7/1995 | Shell et al. . |
| 5,593,907 | 1/1997 | Anjum et al. . |
| 5,607,884 | 3/1997 | Byun . |
| 5,675,159 | 10/1997 | Oku et al. . |
| 5,716,861 | 2/1998 | Moslehi . |
| 5,793,090 | 8/1998 | Gardner et al. . |
| 5,811,323 | 9/1998 | Miyasaka et al. . |
| 5,825,066 | 10/1998 | Buynoski . |
| 5,856,225 | 1/1999 | Lee et al. . |
| 5,858,843 | 1/1999 | Doyle et al. . |
| 6,020,024 | * 2/2000 | Maiti et al. ........................ 427/248.1 |
| 6,059,553 | * 5/2000 | Jin et al. ............................. 421/387 |
| 6,087,234 | * 7/2000 | Wu ....................................... 438/299 |

FOREIGN PATENT DOCUMENTS

| | | |
|---|---|---|
| 3-248433 | 3/1991 | (JP) . |
| 4-123439 | 4/1992 | (JP) . |
| 5-160396 | 5/1993 | (JP) . |

OTHER PUBLICATIONS

"Low–Dielectric–Constant Materials for ULSI Interlayer–Dielectric Applications", Wei William Lee, MRS Bulletin Oct. 1997.

"Sub–100nm Gate Length Metal Gate NMOS Transistors Fabricated by a Replacement Gate Process", A. Chatterjee, International Electronic Devices Meeting, 1997, Washington DC, Dec. 7–10, 1997.

* cited by examiner

Primary Examiner—Olik Chaudhuri
Assistant Examiner—Wai-Sing Louie
(74) Attorney, Agent, or Firm—Foley & Lardner

(57) ABSTRACT

A method of fabricating an integrated circuit with less susceptibility to gate-edge fringing field effect is disclosed. The transistor includes a low-k dielectric spacer and a high-k gate dielectric. The high-k gate dielectric can be tantalum pentaoxide or titanium dioxide. The process can be utilized for P-channel or N-channel metal oxide field semiconductor effect transistors (MOSFETs).

20 Claims, 4 Drawing Sheets

MOSFET WITH SUPPRESSED GATE-EDGE FRINGING FIELD EFFECT

CROSS REFERENCE TO RELATED APPLICATIONS

This patent application is related to U.S. Application Ser. No. 09/187,635, by Yu et al., entitled "A Damascene Process for Forming Ultra-Shallow Source/Drain Extensions and Pocket in ULSI MOSFET", filed on Nov. 6, 1998, and assigned to the assignee of the present invention. This patent application is also related to U.S. Application No. 09/255,546, by Yu, entitled "Locally Confined Deep Pocket Process for ULSI MOSFETS", and U.S. Application Ser. No. 09/255,604, by Yu et al., entitled "A Process for Forming Ultra-Shallow Source/Drain Extensions", and U.S. Application Ser. No. 09/303,693, by Xiang et al., entitled "Self-Aligned Source/Drain Extension Engineering CMOS Process with Self-Aligned Damascene Gate and Contact", and U.S. Application Ser. No. 09/303,694, by Xiang et al., entitled "A New High-k Gate Dielectric CMOS Process with Self-Aligned Damascene Contact to Damascene Metal Gate", and U.S. Application Ser. No. 09/304,129, by Xiang et al., entitled "A New High-K Gate Dielectric CMOS Process with Self-Aligned Damascene Contact to Damascene Metal Gate and Low-k Intra-Level Dielectric", filed on an even date herewith and assigned to the assignee of the present invention.

FIELD OF THE INVENTION

The present invention relates to integrated circuits and methods of manufacturing integrated circuits. More particularly, the present invention relates to an integrated circuit with transistors having suppressed gate-edge fringing effects and a method of making such transistors.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include gate stacks or structures disposed between drain and source regions. The gate structure typically includes a conductive layer that has a rectangular cross-section and a dielectric or gate oxide layer. The conductive layer is disposed over the dielectric layer. The drain and source regions are typically heavily doped with a P-type dopant (boron) or an N-type dopant (phosphorous).

The drain and source regions generally include a thin extension that is disposed partially underneath the dielectric layer of the gate stack to enhance the transistor performance. Shallow source and drain extensions help to achieve immunity to short-channel effects, which degrade transistor performance for both N-channel and P-channel transistors. Short-channel effects can cause threshold voltage roll-off and drain-induced barrier-lowering. Shallow source and drain extensions and, hence, controlling short-channel effects, are particularly important as transistors become smaller.

As transistors disposed on integrated circuits (ICs) become smaller (e.g., transistors with gate lengths approaching 50 nm), transistors become more susceptible to gate-edge fringing field effects. A fringing electrical field exists near the edges of the gate stack of transistors, such as, MOSFETS. The fringing electrical field has negative effects on transistor performance. For example, the fringing field can produce a fringing overlap capacitance that is non-zero even when an overlap does not exist between the gate and the source/drain region (i.e., the gate stack and the source/drain extensions).

Generally, conventional gate dielectric materials, such as, silicon dioxide, are less applicable as transistor size is decreased. For example, gate dielectrics consisting of silicon dioxide can be subject to high leakage current caused by "direct tunneling effect." As channel lengths approach 50 nm or less, high dielectric constant (k) dielectric materials must replace medium to low-k materials (e.g., k<8.0) as the gate dielectric layer. Silicon dioxide has a k value of approximately 3.9.

For advanced ULSI MOS transistors, high dielectric constant (k) material, such as, titanium dioxide ($TiO_2$), or tantalum pentaoxide ($Ta_2O_5$), can be used as a gate insulator or a dielectric layer to suppress tunneling leakage current. In MOSFETs with high-k (k>25) gate dielectric materials, the fringing field effect near the gate stack is more significant than conventional MOSFETs, which utilize a medium or low-k dielectric material, such as, silicon dioxide. Accordingly, transistors with high-k dielectric materials are more susceptible to gate-edge fringing field effects. In small transistors, the contribution of the fringing capacitance to the total overlap capacitance can be extremely significant (e.g., more than 50 percent). The gate-edge fringing field effect can even adversely affect the ability of the gate conductor to couple to the channel and to the source/drain extensions. The gate-edge fringing field effect can also degrade the control of charges in the channel by the gate stack, thereby degrading subthreshold characteristics of the transistor.

Thus, there is a need for a MOSFET transistor that is less susceptible to gate-edge fringing field effects. Further still, there is a need for a MOSFET that includes a high-k gate dielectric material. Further still, there is a need for an efficient method of manufacturing a MOSFET that has suppressed gate-edge fringing field effects.

SUMMARY OF THE INVENTION

The present invention relates to a method of manufacturing an integrated circuit. The method includes providing a gate structure between a source region and a drain region in a semiconductor substrate. The gate structure includes a plurality of sacrificial dielectric spacers. The method also includes removing the sacrificial dielectric spacers, providing a plurality of low-k dielectric spacers, and providing an insulative layer over the gate structure.

The present invention further relates to a method of manufacturing an ultra-large scale integrated circuit including a plurality of field effect transistors. The method includes steps of forming at least part of a gate structure on a top surface of a semiconductor substrate and between a source and a drain. The gate structure includes a high-k gate dielectric material and a spacer. The source and the drain are covered by a silicide layer. The method also includes steps of removing the spacer, and providing a low-k gate dielectric spacer.

The present invention is even further related to an integrated circuit. The integrated circuit includes a transistor having a gate structure on a top surface of a semiconductor substrate and disposed between a source and a drain. The gate structure has a low-k dielectric spacer and a high-k gate dielectric layer.

BRIEF DESCRIPTION OF THE DRAWINGS

The exemplary embodiments of the present invention will hereinafter be described with reference to the accompanying drawings, wherein like numerals denote like elements.

DETAILED DESCRIPTION OF THE PREFERRED EXEMPLARY EMBODIMENTS

Figure 1:
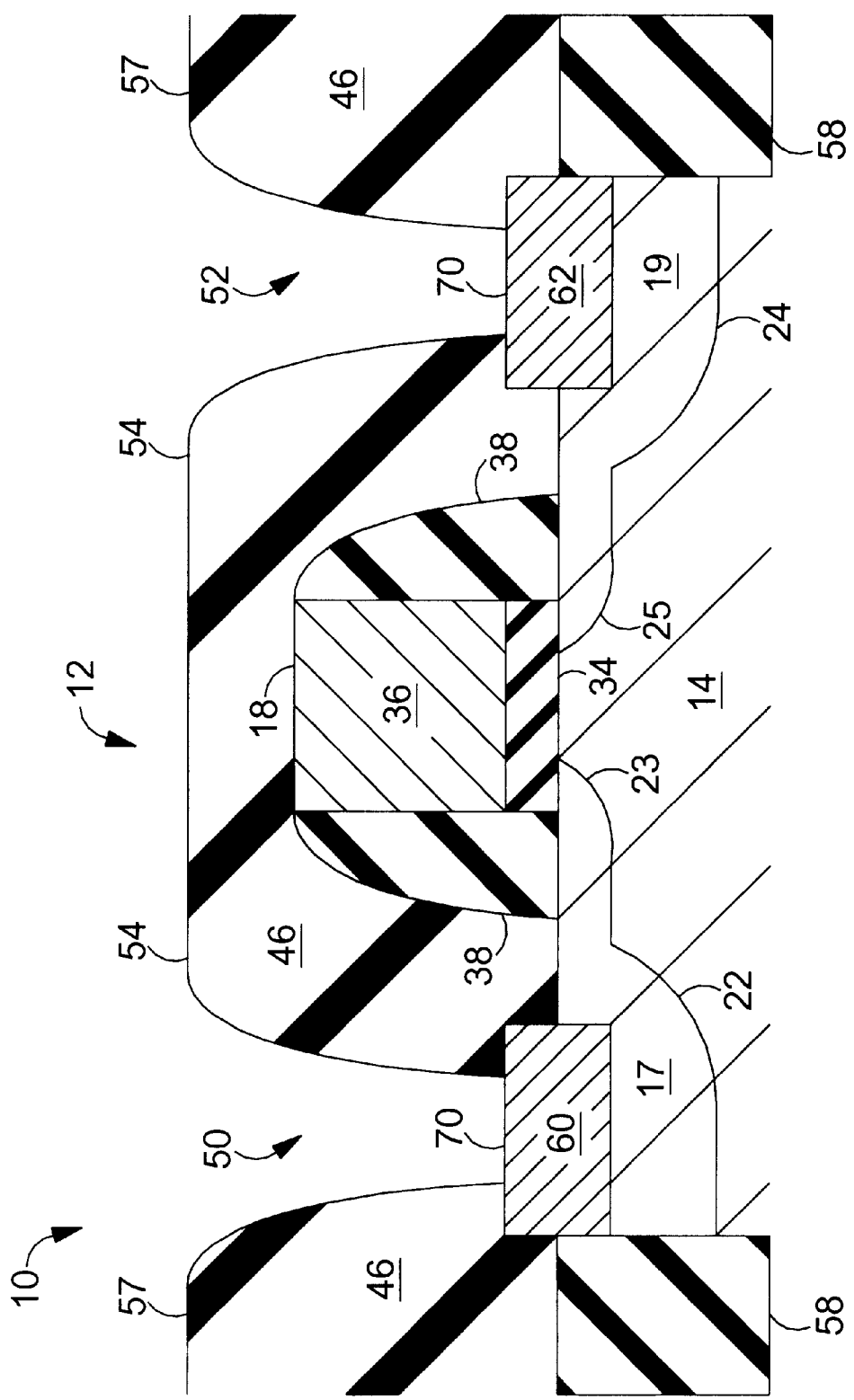
FIG. 1 is a cross-sectional view of a portion of the integrated circuit in accordance with an exemplary embodiment of the present invention.

With reference to FIG. 1, a transistor 12 is disposed on a semiconductor substrate 14, such as, a single crystal silicon wafer. Transistor 12 is part of a portion 10 of an integrated circuit (IC) manufactured on a wafer (such as, a silicon wafer). Transistor 12 preferably has a gate length of less than 100 nanometer (nm) (e.g., approaching 50 um). Substrate 14 can be any semiconductor material, including gallium arsenide (GaAs), silicon (Si), germanium (Ge), or other material. Alternatively, substrate 14 can be a thin-film layer that is part of a silicon-on-insulator substrate.

Transistor 12 includes a gate stack or structure 18, a source region 22, and a drain region 24. Source region 22 and drain region 24 also include a source extension 23 and a drain extension 25, respectively. In the exemplary embodiment, source region 22 and drain region 24 have deep contact regions 17 and 19, respectively, which are 60–120 nm deep (60–120 nm below a top surface 39 of substrate 14).

Transistor 12 can be an N-channel or a P-channel field effect transistor (FET). Transistor 12 can be subject to two-dimensional channel-doping engineering and includes pocket or halo implant regions. Regions 22 and 24 can be planar, as shown in FIG. 1, or can be raised or elevated source and drain regions.

Extensions 23 and 25 are preferably ultra-shallow extensions (e.g., junction depth is less than 15–30 nm), which are thinner (i.e., shallower) than regions 17 and 19 of regions 22 and 24. Each of extensions 23 and 25 has a width of 40–80 nm (from left-to-right) and is integral with regions 22 and 24, respectively. Extensions 23 and 25 are disposed partially underneath a gate dielectric layer 34. Ultra-shallow extensions 23 and 25 help transistor 12 achieve substantial immunity to short-channel effects. Short-channel effects can degrade performance of transistor 12, as well as the manufacturability of the IC associated with transistor 12. Regions 22 and 24 and, hence, extensions 23 and 25, have a concentration of $10^{19}$ to $10^{20}$ dopants per cubic centimeter.

Gate dielectric layer 34 of transistor 12 advantageously has a high dielectric constant (k) value. For example, layer 34 preferably has a k value of greater than 20 (preferably, greater than 25). Gate dielectric layer 34 can be a high-k dielectric material, such as, titanium dioxide ($TiO_2$), tantalum pentaoxide ($Ta_2O_5$), aluminum oxide ($Al_2O_3$), or other insulators. Gate dielectric layer 34 is a gate insulator which suppresses tunneling leakage current. Layer 34 can also be a composite of several insulating layers made from different materials (e.g., $S_iO_2$, $TiO_2$, $TaO_5$, $Si_3N_4$, etc.).

Transistor 12 can be an N-channel or a P-channel metal oxide semiconductor field effect transistor (MOSFET), having a width of less than 10 microns. Transistor 12 is provided between two insulative structures 58, which can be shallow trench isolation structures. Alternatively, other isolation structures, such as, silicon dioxide structures fabricated by local oxidation of silicon (LOCOS), can be utilized.

Gate structure 18 is preferably 1000–2000 Å thick and includes gate dielectric layer 34 and a gate conductor 36. Gate dielectric layer 34 is preferably conformally deposited on substrate 14 to a thickness of 50–150 Å. Layer 34 can be deposited as an amorphous material. Layer 34 is selectively etched to provide the portion shown in FIG. 1.

Alternatively, layer 34 can be provided according to a spin-on technique. In another alternative, layer 34 can be a lower-k insulative layer, such as, a silicon nitride ($Si3N4$), silicon dioxide, or a silicon oxynitride (SiON) layer grown or provided by chemical vapor deposition (CVD).

Conductor 36 can be deposited by chemical vapor deposition (CVD) and, with high-k gate dielectric layer 34, can be etched in a lithographic process to form the particular gate structure 18 for transistor 12. Conductor 36 is preferably a metal (e.g., molybdenum (Mo), titanium (Ti), tungsten (W), aluminum (Al), titanium nitride (TiN), or a semiconductive material, such as, polysilicon or polysilicon/germanium doped with P-type or N-type dopants.

Transistor 12 also includes a pair of low-k dielectric spacers 38. Low-k dielectric spacers 38 can be 1,000–2,000 Å thick and 30–40 nm wide. Spacers 38 are preferably less than half of the width of extensions 23 and 25. Spacers 38 can be manufactured from a variety of low-k materials.

The use of spacers 38 manufactured from low-k material advantageously reduces the gate-edge fringing capacitance associated at transistor 12 (especially transistor 12, which utilizes a high-k gate dielectric layer 34). Spacers 38 preferably have a k value of less than 2.0. The low-k material around the edges of gate structure 18 suppresses gate-edge fringing field effects so high-k gate dielectric layer 34 can be utilized with transistor 12. Thus, spacers 38 advantageously reduce overlap capacitance resulting from the gate-edge fringing electrical fields, thereby benefiting the speed of the transistor. Additionally, spacers 38 significantly improve sub-threshold voltage characteristics and low-voltage control of ultra-thin transistors, such as, transistor 12.

The low-k materials (k less than 3.0, preferably less than 2.0) can be created from vapor deposition and spin-on coating techniques. For example, vapor deposition of parylene and polynapthalene families of polymers and polytetrafluoroethylene (PTFE) can be utilized to form low-k materials. Alternatively, plasma enhanced chemical vapor deposition (PECVD), high density plasma CVD of fluorinated $SiO_2$ glass, and amorphous C:F can form the low-k dielectric material. Air-gap formation and plasma polymerization of pentafluorostyrene and pulse plasma polymerization of PTFE can also be utilized. Additionally, materials can be deposited by spin coating; spin coating materials include organic polymers (fluorinated or non-fluorinated), inorganic polymers (nonporous), inorganic-organic hybrids, or porous materials (xerogels or aerogels). Low-k material synthesis is described in an article entitled "Low-Dielectric Constant Materials for ULSI Interlayer Dielectric Applications", by Wei William Lee and Paul S. Ho, *MRS Bulletin* (October 1997), pages 19–23.

A silicide layer 70 is formed over drain region 24 and source region 22 of transistor 12. A portion 60 of silicide layer 70 is provided over source region 22, and a portion 62 of silicide layer 70 is provided over drain region 24. Portions 60 and 62 are preferably 100–200 Å thick layers of titanium silicide (TiSi$_2$), nickel silicide (NiSi$_2$), cobalt silicide (CoSi$_2$), or other conductive materials. Seventy percent (70–140 Å) of portions 60 and 62 extend below top surface 39 of substrate 14.

Preferably, layer 34 is deposited or formed after silicidation such that heat associated with the silicide process does not affect layer 34. Alternatively, silicide layer 70 can be formed utilizing a nickel silicide process at low temperature so layer 34 is not affected. Alternatively, a damascene process can be utilized where a sacrificial gate oxide and a sacrificial gate conductor are removed after layer 70 is formed and other high temperature processes are performed.

Most elements of transistor 12 can be manufactured according to conventional complementary metal oxide semiconductor (CMOS) process steps. Transistor 12 can be at least partially covered by insulative layer 46 in a CVD TEOS process and is preferably part of an ultra-large scale integrated (ULSI) circuit that includes 1,000,000 or more transistors. Insulative layer is preferably 1000 Å thick. Vias or holes 50 and 52 are etched in insulative layer 46 to form spacer section 54 and sections 57. Spacer section 54 covers gate structure 18 and spacers 38. Sections 57 cover structures 58.

With reference to FIGS. 1–4, the fabrication of transistor 12, including high-k gate dielectric layer 34 and low-k dielectric spacers 38, is described below as follows. Conventional CMOS processes are utilized to form most of the elements of transistor 12 shown in FIG. 2.

In an exemplary embodiment, a conventional double-implant process can form source and drain regions 22 and 24. Source and drain extensions 23 and 25, respectively, are formed by doping both sides of gate structure 18 before sidewall spacers 56 are formed via a conventional doping process, such as, a diffusion process or ion-implantation process. Without sidewall spacers 56, the doping process introduces dopants into a thin region (i.e., just below the top surface of substrate 14) to form the source and drain extensions 23 and 25, respectively, as well as to partially form source and drain regions 22 and 24, respectively.

After source and drain extensions 23 and 25, respectively, are formed, spacers 56, which abut lateral sides of gate structure 18, are provided over source and drain extensions 23 and 25. Substrate 14 is doped a second time to form the deeper source and drain regions (regions 17 and 19). Source and drain extensions 23 and 25 are not further doped due to the blocking capability of spacers 38. In another alternative, portions 60 and 62 are used as a mask after regions 17 and 19 are formed to implant regions 23 and 25.

Preferably, layer 34 is deposited as an amorphous Ta$_2$O$_5$ layer, a TiO2 layer, or an Al$_2$O$_3$ layer after a sacrificial dielectric layer and gate conductor are removed from structure 18. Layer 34 is deposited after high-temperature processes (e.g., greater than 800° C.) are completed (e.g., silicidation, dopant activation, etc.).

Figure 2:
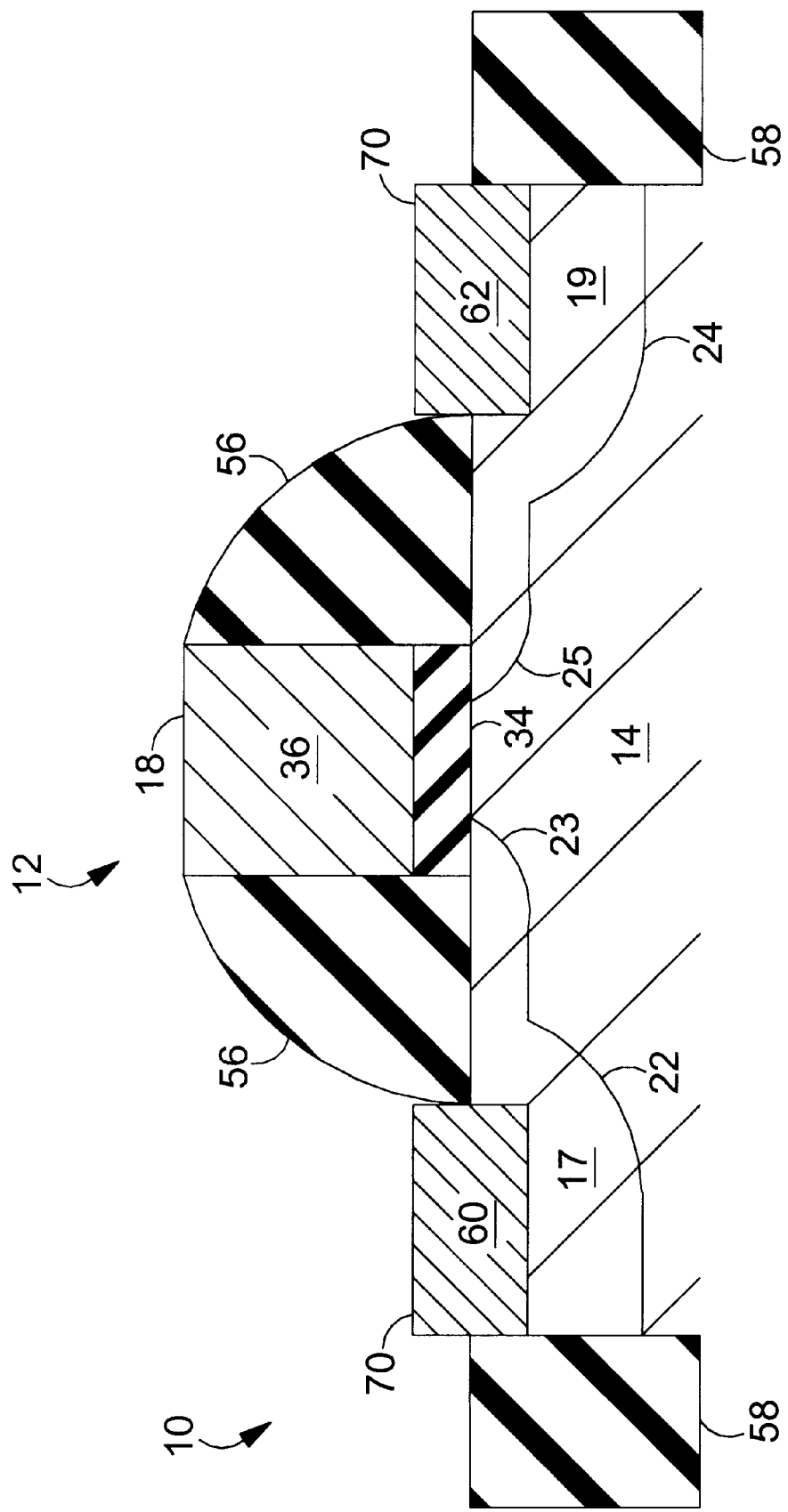
FIG. 2 is a cross-sectional view of the portion of the integrated circuit illustrated in FIG. 1, showing a gate structure forming step.

In FIG. 2, transistor 12 can be substantially formed by conventional semiconductor processing techniques to form gate structure 18, including gate oxide or dielectric layer 34, dummy or sacrificial spacers 56, gate conductor 36, source region 22, and drain region 24. Transistor 12 is provided between structures 58.

Dopants in regions 22 and 24 and extensions 23 and 25 are preferably activated by a rapid thermal annealing (RTA) before layer 34 is deposited. Layer 34 is preferably conformally deposited by CVD after a pad oxide layer between spacers 56 is removed. The pad oxide layer is disposed on the top surface of substrate 14. Alternatively, a buffer oxide can be deposited to provide an interface between layer 34 and substrate 14.

Gate conductor 36 is deposited as a conformal layer over layer 34. Conductors 34 and 36 are dry etched to form the structure in gate structure 18 (FIG. 1). Alternatively, other selective removal processes can be utilized for structure 18.

Substrate 14 is doped in an ion-implantation process or diffusion process to form source region 22 and drain region 24. Regions 22 and 24 extend deeply below (e.g., 60–120 nm) top surface 39 of substrate 14. Source region 22 and drain region 24 can be heavily doped with boron (B) or phosphorous (P), depending upon the type of transistor 12. Alternatively, other dopants can be utilized.

Thus, a lower thermal budget can be utilized after the structure in FIG. 2 is formed because portions 60 and 62 are already provided. Spacers 56 are dummy or sacrificial spacers. Spacers 56 can be silicon dioxide (SiO$_2$) or silicon nitride (Si$_3$N$_4$) formed in a conventional process before or after layer 34 is deposited. A layer for spacers 56 can be conformally deposited in a plasma enhanced chemical vapor deposition (PECVD) process as a 1,000 to over 2,000 Å thick layer provided over structure 12. Preferably, spacers 56 are silicon nitride (Si3N$_4$).

The conformal layer associated with spacers 56 is selectively etched (e.g., etched back) to leave spacers 56 adjacent gate stack 18. Spacers 56 are each preferably 1,000–2,000 Å thick, and each of spacers 56 is approximately 500–800 Å wide. Alternatively, other materials can be utilized for spacers 56.

After spacers 56 are provided adjacent gate structure 18, portion 10 is subjected to a conventional silicidation process to form silicide portions 60 and 62. Portions 60 and 62 can be formed in a conventional process, wherein a refractory metal (e.g., Co, Ti, Ni) is deposited by CVD and reacted with exposed surfaces of silicon associated with conductor 36, region 22, and region 24. A silicide portion can also be provided above gate conductor 36. Nickel can be utilized if a low temperature (600° C) silicidation process is required.

Atoms of the refractory metal react with the exposed silicon (e.g., in a thermal process) to form silicide material. The refractory metal does not react with spacers 56 (silicon nitride). Therefore, silicide layer 70 is not formed on spacers 56. After the reaction, which forms portions 60 and 62, the unreacted refractory metal is removed. Portions 60 and 62 advantageously reduce contact resistance associated with transistor 12.

Figure 3:
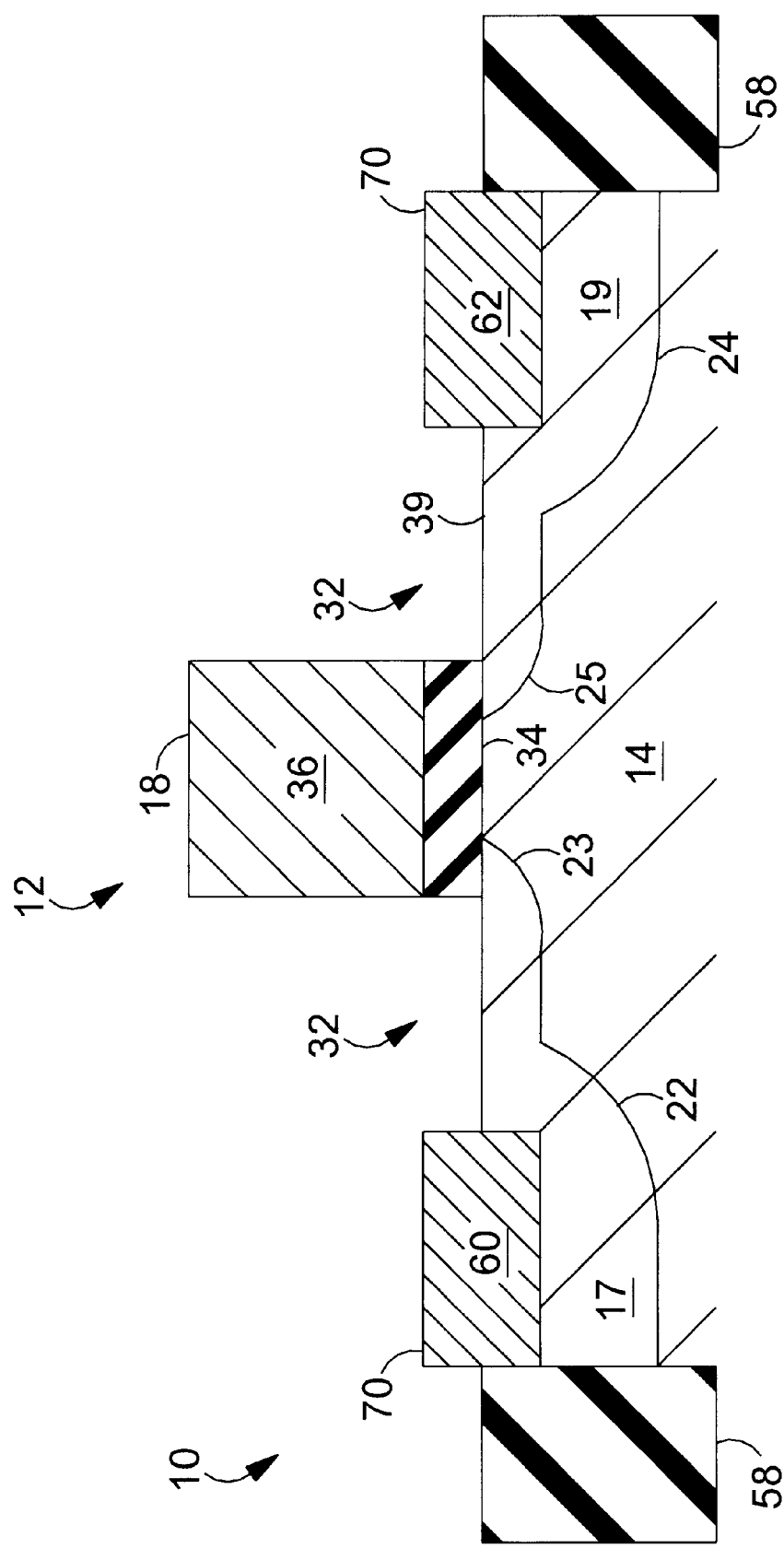
FIG. 3 is a cross-sectional view of the portion of the integrated circuit illustrated in FIG. 1, showing a wet chemical-etching step.

In FIG. 3, after portions 60 and 62 are formed, spacers 56 are removed to leave openings 32 adjacent gate structure 18. Openings 32 define a space of exposed silicon on substrate 14 above extensions 23 and 25. Openings 32 are between portion 60 and gate structure 18 and between gate structure 18 and portion 62.

Spacers 56 can be stripped from portion 10 by any removal process, including a wet chemical-etching process, a dry-etching process, or a plasma dry-etching process. Spacers 56 are preferably removed in a wet chemical-etching process. The wet-etching process is preferably selective to silicon nitride with respect to silicon, to layer 34, and to conductor 36 as to not affect substrate 14, structures 58, and gate structure 18. Alternatively, structures 58 and gate conductor 36 can be covered by a protection layer. Portions 60 and 62 advantageously protect substrate 14. Openings 32 are preferably 500–800 Å in width.

Figure 4:
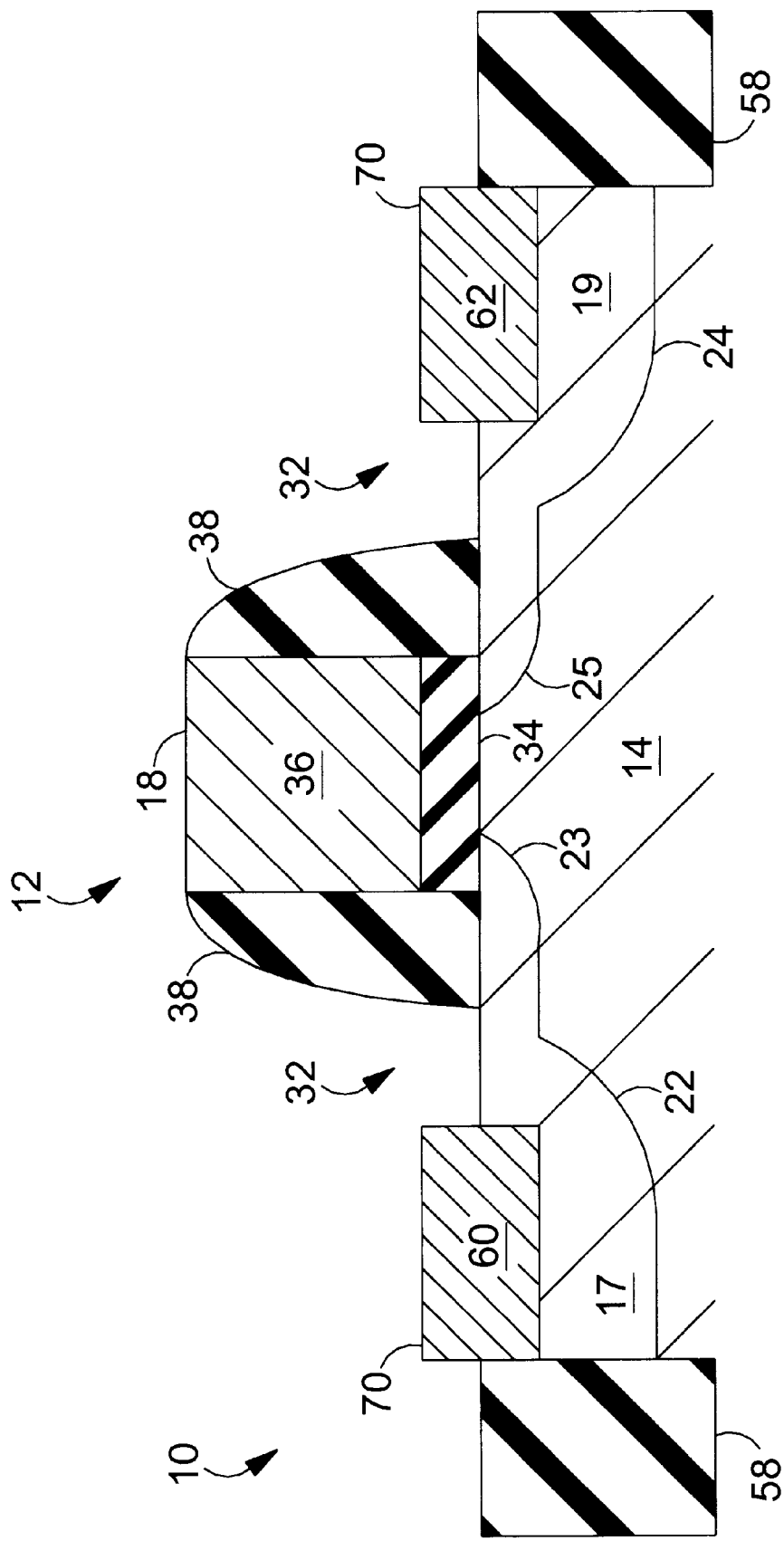
FIG. 4 is a cross-sectional view of the portion of the circuit illustrated in FIG. 1, showing a low-k dielectric spacer forming step.

In FIG. 4, spacers 38 are formed from a low-k dielectric material, as described above with reference to FIG. 1. A conformal layer of low-k dielectric material is provided over transistor 12. Preferably, the conformal layer is deposited by CVD over gate structure 18 and selectively etched to leave spacers 38 abutting the sides of gate structure 18. Alternatively, spacers 38 can be deposited in a spin-on technique or other process. Preferably, the low-k dielectric conformal layer is Xerogel (e.g., porous $SiO_2$) material, is 200–250 nm thick, and is etched by anisotropic plasma dry-etch. Spacers 38 fill up to one-half of the space associated with openings 32 (e.g., 300–400 Å wide).

In FIG. 1, insulative layer 46 is provided over transistor 12 (e.g., structures 58, gate structure 18, portion 60, portion 62, and openings 32). Insulative layer 46 is preferably a thick silicon dioxide layer deposited in a tetraorthosilicate (TEOS) process at a low temperature (e.g., less than 400° C.). Insulative layer 46 is initially 500–1000 nm thick.

Layer 46 is subjected to a chemical mechanical polish (CMP) to planarize layer 46. Layer 46 is etched to form vias 50 and 52 for contacts and local interconnects. Vias 50 and 52 expose portions 60 and 62, respectively. A conventional CMOS process can be utilized to form contacts and interconnects for transistor 12 and otherwise complete fabrication of portion 10.

It is understood that, while preferred embodiments, examples, materials, and values are given, they are for the purpose of illustration only. The apparatus and method of the invention are not limited to the precise details and conditions disclosed. For example, although wet-etching techniques are discussed, other methods could be utilized to remove structures. Thus, changes may be made to the details disclosed without departing from the spirit of the invention, which is defined by the following claims.

What is claimed is:

1. An integrated circuit comprising a transistor having a gate structure on a top surface of a semiconductor substrate and disposed between a source and a drain, the gate structure having a low-k dielectric spacer and a high-k gate dielectric layer where the wherein the low-k dielectric spacer has a k value of less than 3 and the high-k gate dielectric value has a k value of more than 25.

2. The integrated circuit of claim 1, wherein the low-k dielectric spacer has a k value of less than 2.

3. The integrated circuit of claim 2, wherein the high-k gate dielectric layer includes $Al_2$.

4. The integrated circuit of claim 2, wherein the low-k dielectric spacer has a width less than a distance between the gate structure and a silicide layer above the drain.

5. An ultra-large scale integrated circuit including a plurality of field effect transistors having low-k dielectric spacers and a high-k gate dielectric layer, each being manufactured by the steps of:

forming at least part of a gate structure on a top surface of a semiconductor substrate and between a source and a drain, the gate structure including the high-k gate dielectric layer and a spacer, the source and the drain being covered by a suicide layer;

removing the spacer; and providing the low-k dielectric spacer.

6. The integrated circuit of claim 5, wherein the low-k dielectric spacer has a width approximately one-half a distance between the gate structure and the silicide layer.

7. The integrated circuit of claim 5, wherein the high-k gate dielectric material is $Al_2O_3$, $Ta_2O_5$, or $TiO_2$.

8. The integrated circuit of claim 5, further comprising: depositing an oxide material over the spacer, the gate structure, and the silicide layer.

9. The integrated circuit of claim 8, wherein the spacer is silicon nitride.

10. The integrated circuit of claim 9, wherein the low-k dielectric spacer is porous silicon dioxide.

11. A field effect transistor, comprising:

a gate structure on a top surface of a semiconductor substrate;

a source region In the semiconductor substrate; and a drain region in the semiconductor substrate, wherein the gate structure is disposed between the source region and the drain region wherein the gate structure includes a pair of low-k dielectric spacers, a high-k gate dielectric layer, and a gate conductor, whereby the transistor has reduced gate-edge fringing capacitance due to the effect of the low-k dielectric spacers, wherein the low-k dielecgtric spacer has a k-value of less than 3 and the high-k dielectric layer has a k value of more than 25.

12. The field effect transistor of claim 11, wherein the low-k gate dielectric spacers each have a width less than a distance between the gate structure and a silicide layer above the drain region and the source region.

13. The field effect transistor of claim 12, wherein the low-k dielectric spacers are manufactured from materials in the parylene family of polymers, the polynpathalene family of polymers, or polytetrafluoroethylene.

14. The field effect transistor of claim 11, wherein the gate conductor is a metal material.

15. The field effect transistor of claim 14, wherein the gate conductor is molybdenum, titanium, tungsten, aluminum, or titanium nitride.

16. The field effect transistor of claim 11, further comprising nickel silicide layers.

17. The field effect transistor of claim 11, wherein the high-k gate dielectric layer is comprised of titanium dioxide, tantalum pentaoxide, or aluminum oxide.

18. The field effect transistor of claim 11, wherein the high-k dielectric layer is 50–150 Å thick.

19. The field effect transistor of claim 11, wherein the low-k dielectric spacers are 30–40 nanometers wide and less in width than a distance between the gate structure and a silicide laver above the drain region.

20. The field effect transistor of claim 11 wherein the low-k dielectric spacer has a k-value of less than 2.

* * * * *

UNITED STATES PATENT AND TRADEMARK OFFICE
CERTIFICATE OF CORRECTION

PATENT NO. : 6,194,748 B1
DATED : February 27, 2001
INVENTOR(S) : Yu

It is certified that error appears in the above-identified patent and that said Letters Patent is hereby corrected as shown below:

Claim 1, column 7,
Line 37, delete "layer where the wherein the low-k" and insert therefor -- layer, where the low-k --.

Claim 3, column 7
Line 43, delete "Al$_2$." and insert therefor -- Al$_2$O$_3$. --.

Claim 5, column 7,
Line 55, delete "suicide" and insert therefor -- silicide --.

Claim 11, column 8,
Line 18, delete "region In the" and insert therefor -- region in the --.
Line 26, delete "dielecgtric" and insert therefor -- dielectric --.
Line 27, delete "ak-value" and insert therefor -- a k value --.

Claim 16, column 8,
Line 43, after "layers." insert therefor -- disposed over the source region and drain region. --.

Claim 19, column 8,
Line 52, delete "laver" and insert therefor -- layer --.

Signed and Sealed this

Eleventh Day of September, 2001

*Attest:*

NICHOLAS P. GODICI
*Attesting Officer*    Acting Director of the United States Patent and Trademark Office